(12) United States Patent
Lee

(10) Patent No.: US 7,316,963 B2
(45) Date of Patent: Jan. 8, 2008

(54) METHOD FOR MANUFACTURING SEMICONDUCTOR DEVICE

(75) Inventor: Won Wook Lee, Gyeonggi-do (KR)

(73) Assignee: Hynix Semiconductor Inc., Icheon-Si (KR)

( * ) Notice: Subject to any disclaimer, the term of this patent is extended or adjusted under 35 U.S.C. 154(b) by 84 days.

(21) Appl. No.: 11/321,590

(22) Filed: Dec. 30, 2005

(65) Prior Publication Data

US 2007/0020889 A1     Jan. 25, 2007

(30) Foreign Application Priority Data

Jul. 19, 2005     (KR)     ...................... 10-2005-0065366

(51) Int. Cl.
*H01L 21/76*     (2006.01)

(52) U.S. Cl. ............... 438/401; 438/462; 438/E21.629; 438/E23.179

(58) Field of Classification Search ........ 438/401–402, 438/462
See application file for complete search history.

(56) References Cited

U.S. PATENT DOCUMENTS

| | | | |
|---|---|---|---|
| 6,218,262 B1* | 4/2001 | Kuroi et al. | ................. 438/401 |
| 2003/0119274 A1* | 6/2003 | Weis | ........................... 438/401 |

* cited by examiner

*Primary Examiner*—Dung A. Le
(74) *Attorney, Agent, or Firm*—Townsend & Townsend & Crew, LLP

(57) ABSTRACT

Disclosed herein is a method for manufacturing a semiconductor device. According to the present invention, a device isolation film having a step difference occurring during a process of forming a device isolation film in a scribe lane region serves as a first alignment key, and a second alignment key formed during a process of forming a recess gate region is used in the subsequent process, thereby improving the process steps and product cost.

10 Claims, 6 Drawing Sheets

METHOD FOR MANUFACTURING SEMICONDUCTOR DEVICE

BACKGROUND OF THE INVENTION

1. Field of the Invention

The present invention relates to a memory device. In particular, the present invention provides a method for manufacturing a semiconductor device, and more specifically to a method for manufacturing a semiconductor device wherein a first alignment key is formed using a step difference occurring during a process of forming a device isolation film on a scribe lane, and a second alignment key is formed on the scribe lane using the first alignment key during a process of forming a recess gate region on a cell region as to skip a key open process, thereby reducing a total around time of manufacturing a semiconductor device and a manufacturing cost for the semiconductor device.

2. Discussion of the Related Art

FIGS. 1a through 1e are cross-sectional views illustrating a conventional method for manufacturing a semiconductor device.

Referring to FIG. 1a, a trench (not shown) defining a device isolation region is formed on a semiconductor substrate 10 having a cell region and a scribe lane. Next, an oxide film (not shown) filling up the trench is formed, and then the oxide film is polished until the semiconductor substrate 10 is exposed to form a device isolation film 20 in the cell region 1000a and the scribe lane 1000b. At this time, since a pattern density in the scribe lane is low as compared to that of the cell region, a step difference on the device isolation film 20 in the scribe lane 1000b occurs and serves as an alignment key 25. The step difference of the alignment key 25 from the surface of the semiconductor substrate 10 ranges 250 Å to 350 Å.

Referring to FIGS. 1b and 1c, a photoresist film pattern 30 only exposing the scribe lane 1000b is formed on the semiconductor substrate 10. Next, a key open process is performed on the device isolation film 20 in the scribe lane 1000b using the photoresist film pattern 30. That is, the alignment key 25 is etched using the photoresist film 30 in the cell region 1000a as an etching mask by a predetermined thickness to make the step difference of the alignment key 25 deeper. Thereafter, the photoresist film pattern 30 is removed. The key open process includes a key open photo process, a key open etching process, a photoresist removing process and a subsequent cleaning process.

Referring to FIG. 1d, a hard mask layer 40 is formed on the entire surface of the semiconductor substrate 10 having the cell region 1001a and the scribe lane 1000b. The hard mask layer 40 is a polysilicon layer.

Referring to FIG. 1e, the hard mask layer 40 is etched using a recess gate mask (not shown) to form a hard mask layer pattern (not shown) defining a recess gate region 50 in the cell region 1000a. Next, the exposed semiconductor substrate 10 is etched using the hard mask layer pattern as an etching mask by a predetermined thickness to form the recess gate region 50 in the cell region 1000a, and then the hard mask layer pattern is removed.

According to the above conventional method for manufacturing a semiconductor device, a further step difference is formed using a key open process on the alignment key formed in the process forming the device isolation film, and then used in a subsequent process forming a gate. However, the key open process has four additional processes such as a key open photo process, a key open etching process, a photoresist removing process and a subsequent cleaning process. Accordingly, there is a problem of increasing TAT (time around time) for manufacturing a semiconductor device and manufacturing cost of the semiconductor device.

SUMMARY OF THE INVENTION

According to the present invention, techniques for a memory device are provided. In particular, the present invention provides a method for manufacturing a semiconductor device wherein a first alignment key is formed using a step difference occurring during a process of forming a device isolation film on a scribe lane, and a second alignment key is formed on the scribe lane using the first alignment key during a process of forming a recess gate region on a cell region as to skip a key open process, thereby reducing a total around time of manufacturing a semiconductor device and a manufacturing cost for the semiconductor device.

In order to achieve the above advantage, an embodiment of the present invention, a method for manufacturing a semiconductor device includes the steps of (a) forming a device isolation film on a cell region and a scribe lane on a semiconductor substrate to define an active region and an alignment key region, respectively, the device isolation film on the scribe lane having a step difference serving as a first alignment key occurs; and (b) forming a recess gate region on the cell region and a second alignment key on the scribe lane.

In order to achieve the above object, another embodiment of the present invention, a method for fabricating a semiconductor device includes the steps of (a) forming a device isolation film on a cell region and a scribe lane on a semiconductor substrate to define an active region and an alignment key region, respectively, the device isolation film on the scribe lane having a step difference serving as a first alignment key occurs; (b) forming a hard mask layer pattern on the entire surface of the semiconductor substrate including the device isolation film to define a recess gate region in the cell region and a second alignment key region in the scribe lane; and (c) etching the semiconductor substrate using the hard mask layer pattern as an etching mask to form the recess gate region in the cell region and the second alignment key in the scribe lane.

DETAILED DESCRIPTION OF THE EXEMPLARY EMBODIMENTS

Reference will now be made in detail to exemplary embodiments of the present invention. Wherever possible, the same reference numbers will be used throughout the drawings to refer to the same or like parts. It should be appreciated that the embodiments are provided for the purpose that one ordinarily skilled in the art would be able to understand the present invention, and modifications in various manners and the scope of the present invention are not limited by the embodiments described herein.

Figure 1A:
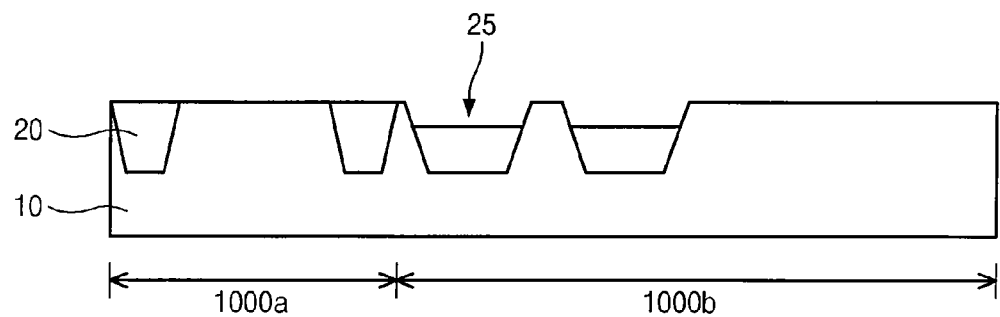
FIGS. 1a through 1e are simplified cross-sectional views illustrating a conventional method for manufacturing a semiconductor device.
Figure 1B:
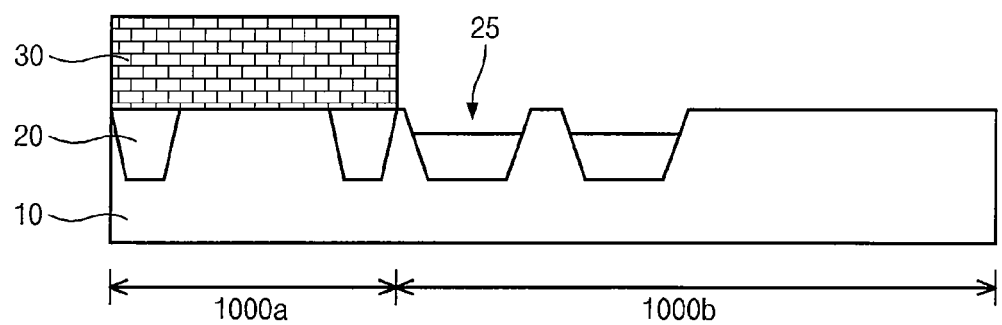
Figure 1C:
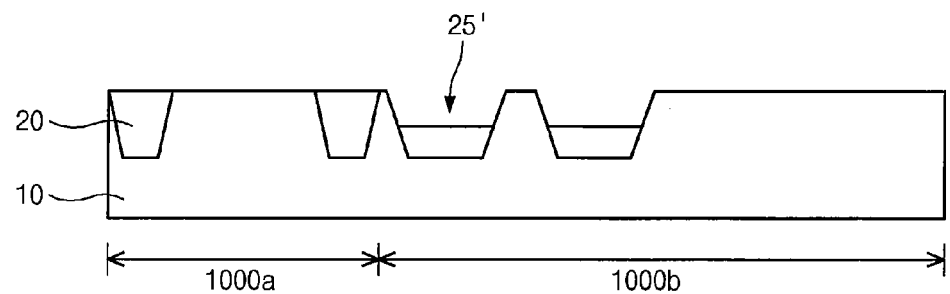
Figure 1D:
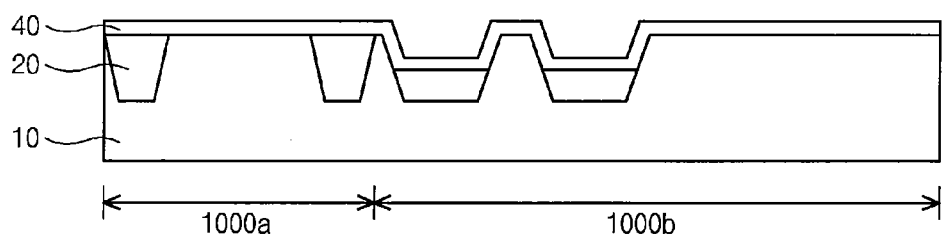
Figure 1E:
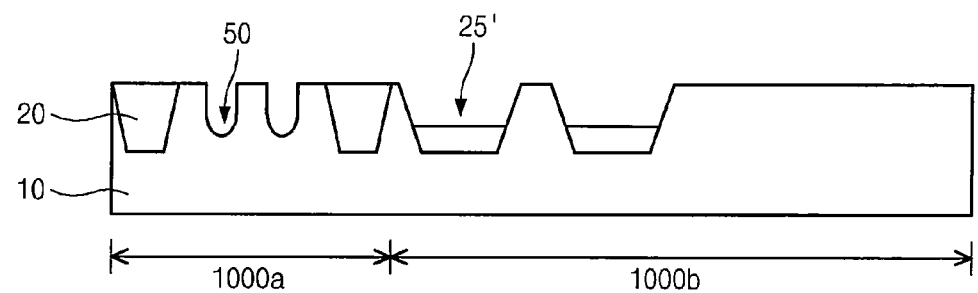
Figure 2A:
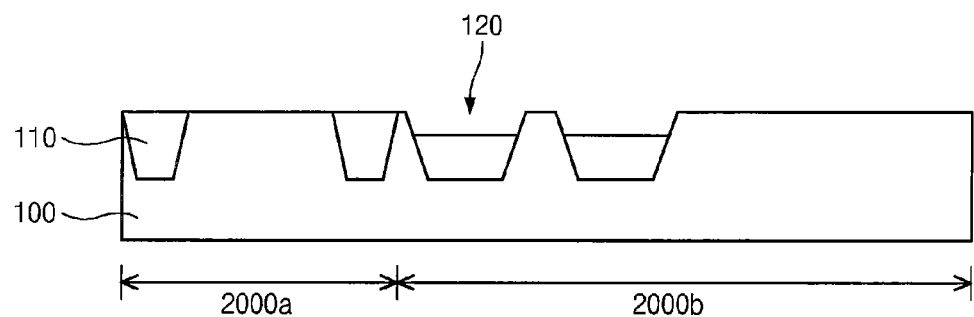
FIGS. 2a through 2c are simplified cross-sectional views illustrating a method for manufacturing a semiconductor device according to an embodiment of the present invention.
Figure 2B:
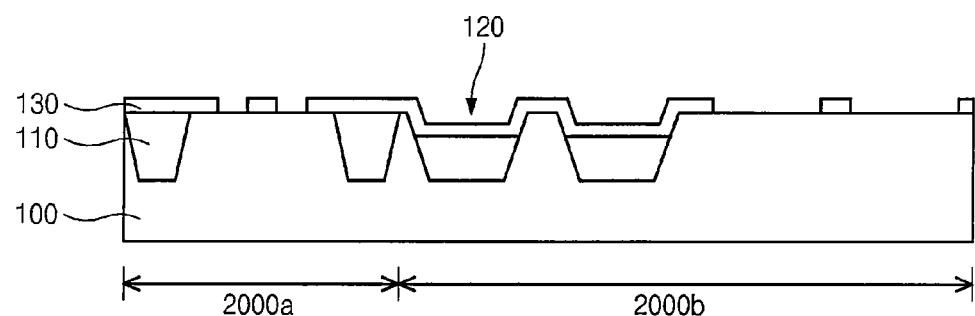
Figure 2C:
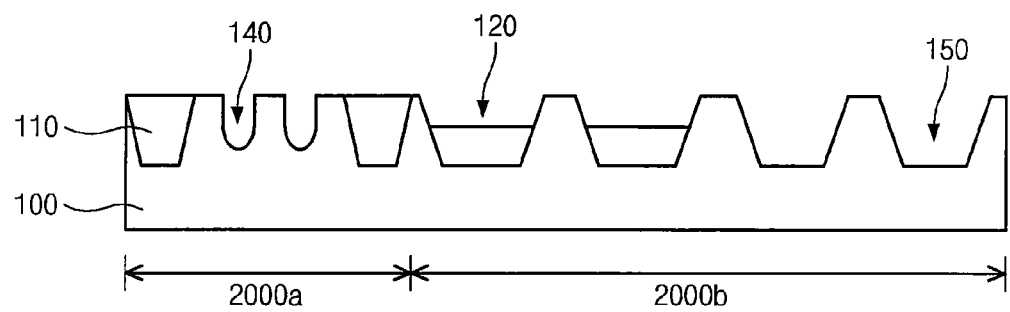

FIGS. 2a through 2c are simplified cross-sectional views illustrating a method for manufacturing a semiconductor device in accordance with an embodiment of the present invention.

Referring to FIG. 2a, a trench (not shown) defining a device isolation region (not shown) is formed on a cell region 2000a and a scribe lane region 2000b on a semiconductor substrate 100. Next, an oxide film filling up the trench is formed and polished to form a device isolation film 110. At this time, a step difference between the device isolation film 110 and the semiconductor substrate 100 occurs on the scribe lane region 2000b because a pattern density on the scribe lane region 2000b is lower than that on the cell region 2000a. The device isolation film 110 having such a step difference on the scribe lane region 2000b serves as a first alignment key 120. The depth of the step difference from the surface of the semiconductor substrate 100 ranges from 250 Å to 350 Å.

Referring to FIGS. 2b and 2c, a hard mask layer pattern 130 defining a recess gate region 140 and an alignment key 150 is formed on the entire surface of the semiconductor substrate 100 having the device isolation film 110 and the first alignment key 120. Next, the exposed semiconductor substrate 100 is etched using the hard mask layer pattern 130 by a predetermined thickness to form a recess gate region 140 in the cell region 2000a and an alignment key 150 in the scribe lane region 2000b, and then the hard mask layer pattern 130 is removed. Here, the hard mask layer pattern 130 is preferably a polysilicon layer. The alignment key 150 is formed beside the alignment key 130, and the depth of the alignment key 150 from the surface of the semiconductor substrate 100 ranges from 1000 Å to 1500 Å, preferably.

According to a preferred embodiment of the present invention, since the key open process is skipped, the alignment key 130 formed during the process forming the device isolation film 110 is used in the process forming the recess gate region 140, the second alignment key 150 formed during the process forming the recess gate region is used in the subsequent process, preferably.

Figure 3A:
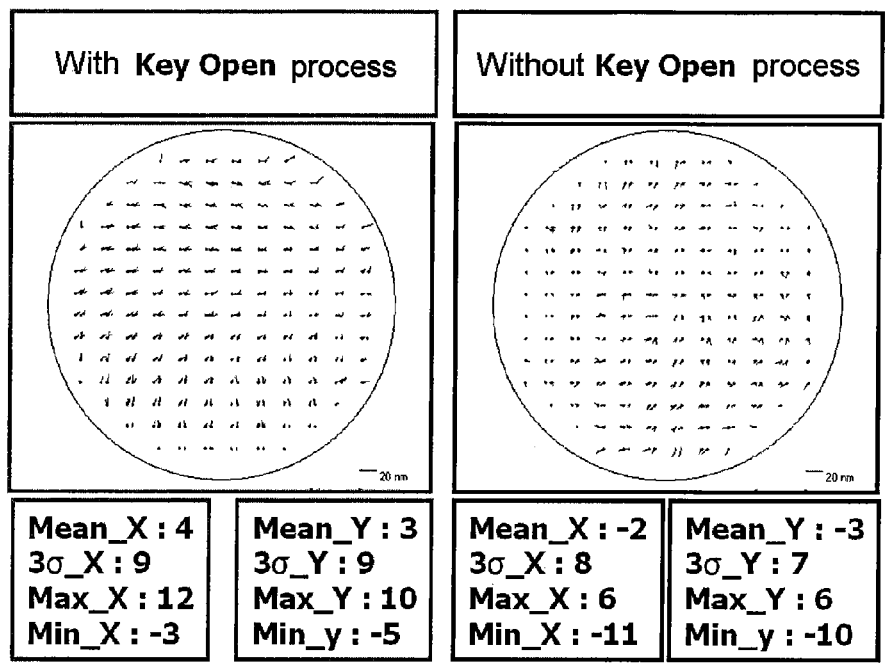
FIGS. 3a and 3b are drawings showing a result measuring overlays according to a conventional method and an embodiment of the present invention, respectively.
Figure 3B:
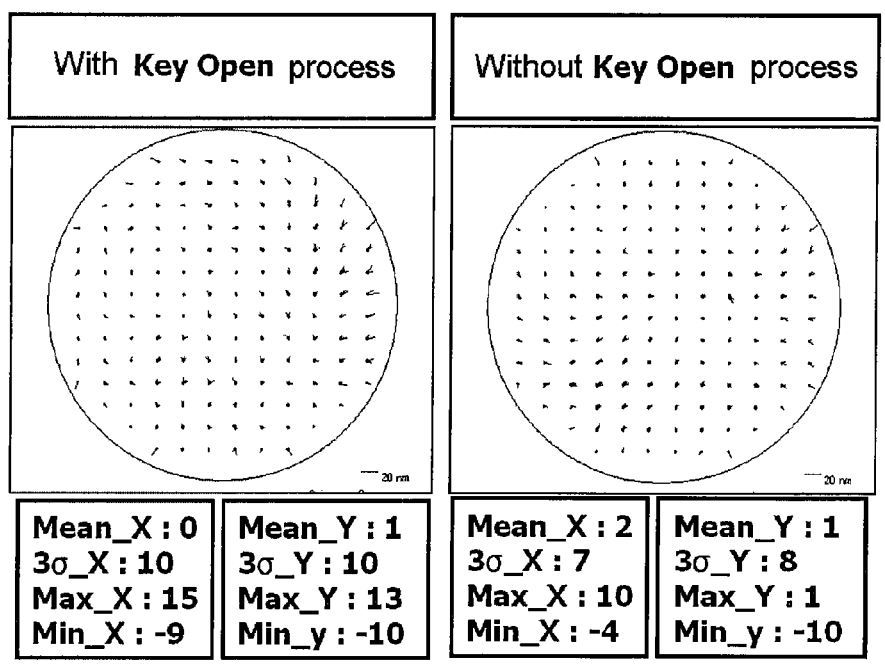

FIGS. 3a and 3b are maps comparing a measured overlay of the conventional method to that of the prevent invention. Referring to 3a and 3b, there is no significant difference between the conventional method, which employs the key open process during the processes forming a recess gate region and a gate, and the present invention skipping the key open process. As a result, the preferred embodiment of the present invention skipping the key open process provides no effect on device characteristics, thus reducing the number of process steps and the production cost.

According to an embodiment of the present invention as described above, a device isolation film having a step difference occurring during a process of forming a device isolation film on a scribe lane region serves as a first alignment key. A second alignment key is formed in a process forming a recess gate region, and then used in the subsequent process. Accordingly, there is an effect of reducing the process steps and product cost due to an omission of the key open process.

The foregoing description of various embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated.

What is claimed is:

1. A method for manufacturing a semiconductor device comprising the steps of:
    (a) forming a device isolation film on a cell region and a scribe lane on a semiconductor substrate to define an active region and an alignment key region, respectively, the device isolation film on the scribe lane having a step difference serving as a first alignment key occurs; and
    (b) forming a recess gate region on the cell region and a second alignment key on the scribe lane, wherein a first thickness of the first alignment key ranges from 250 Å to 350 Å.

2. The method according to claim 1, wherein the first alignment key serves as an alignment key for a recess gate mask to align with the active region during a process forming a recess gate region.

3. The method according to claim 1, wherein a second thickness of the second alignment key ranges from 1000 Å to 1500 Å, and the second alignment key is spaced apart from the first alignment key by a predetermined distance.

4. The method according to claim 1, wherein the second alignment key serves as an alignment key for a gate mask to align with the recess gate region during a process forming a gate.

5. A method for manufacturing a semiconductor device comprising the steps of:
    (a) forming a device isolation film on a cell region and a scribe lane on a semiconductor substrate to define an active region and an alignment key region, respectively, the device isolation film on the scribe lane having a step difference serving as a first alignment key occurs;
    (b) forming a hard mask layer pattern on an entire surface of the semiconductor substrate including the device isolation film to define a recess gate region in the cell region and a second alignment key region in the scribe lane; and
    (c) etching the semiconductor substrate using the hard mask layer pattern as an etching mask to form the recess gate region in the cell region and the second alignment key in the scribe lane.

6. The method according to claim 5, wherein a first thickness of the first alignment key ranges from 250 Å to 350 Å.

7. The method according to claim 5, wherein the first alignment key serves as an alignment key for a recess gate mask to align with the active region during a process forming a recess gate region.

8. The method according to claim 5, wherein the hard mask layer is a polysilicon layer.

9. The method according to claim 5, wherein a second thickness of the second alignment key ranges from 1000 Å to 1500 Å, and the second alignment key is spaced apart from the first alignment key by a predetermined distance.

10. The method according to claim 5, wherein the second alignment key serves as an alignment key for a gate mask to align with the recess gate region during a process forming a gate.

* * * * *